United States Patent
Pan et al.

(10) Patent No.: US 10,483,939 B2
(45) Date of Patent: Nov. 19, 2019

(54) DOWNHOLE LOGGING TOOL USING RESONANT CAVITY ANTENNAS WITH REAL-TIME IMPEDANCE MATCHING

(71) Applicant: Halliburton Energy Services, Inc., Houston, TX (US)

(72) Inventors: Li Pan, Singapore (SG); Luis Emilio San Martin, Houston, TX (US); Rencheng Song, Singapore (SG)

(73) Assignee: Halliburton Energy Services, Inc., Houston, TX (US)

( * ) Notice: Subject to any disclaimer, the term of this patent is extended or adjusted under 35 U.S.C. 154(b) by 10 days.

(21) Appl. No.: 15/765,671

(22) PCT Filed: Nov. 13, 2015

(86) PCT No.: PCT/US2015/060688
§ 371 (c)(1),
(2) Date: Apr. 3, 2018

(87) PCT Pub. No.: WO2017/082931
PCT Pub. Date: May 18, 2017

(65) Prior Publication Data
US 2018/0294791 A1  Oct. 11, 2018

(51) Int. Cl.
*H03H 7/38* (2006.01)
*G01V 3/26* (2006.01)
(Continued)

(52) U.S. Cl.
CPC .......... *H03H 7/38* (2013.01); *E21B 47/122* (2013.01); *G01V 3/26* (2013.01); *G01V 3/30* (2013.01); *H04B 1/0458* (2013.01)

(58) Field of Classification Search
CPC .......... H03H 7/38; E21B 47/122; G01V 3/26; G01V 3/30; H04B 1/0458
See application file for complete search history.

(56) References Cited

U.S. PATENT DOCUMENTS

| 4,373,581 A | 2/1983 | Toellner |
| 4,704,581 A | 11/1987 | Clark |

(Continued)

FOREIGN PATENT DOCUMENTS

| GB | 2502848 | 12/2013 |
| WO | 2005091883 | 10/2005 |
| WO | 2012144979 | 10/2012 |

OTHER PUBLICATIONS

International Search Report and Written Opinion for PCT/US2015/060688 dated Aug. 10, 2016.

(Continued)

*Primary Examiner* — Stephen E. Jones
*Assistant Examiner* — Samuel S Outten
(74) *Attorney, Agent, or Firm* — Benjamin Fite; C. Tumey Law Group PLLC

(57) ABSTRACT

A method of real-time impedance matching includes conveying a tool through a borehole where the tool includes a transmit cavity antenna and receive cavity antenna for transmitting and receiving signals through a subsurface formation. The tool also includes a cable for routing signals within the tool and at least one variable inductor or variable capacitor in an impedance-matching circuit. The method further includes measuring a reflection of a signal transmitted through the formation and determining a target impedance based on the impedance of the cable and the reflection. The method further includes adjusting the at least one variable inductor or variable capacitor such that the impedance of the matching circuit substantially equals the target impedance and receiving a signal from the formation via the adjusted impedance of the matching circuit.

19 Claims, 5 Drawing Sheets

(51) Int. Cl.
*E21B 47/12* (2012.01)
*G01V 3/30* (2006.01)
*H04B 1/04* (2006.01)

(56) References Cited

U.S. PATENT DOCUMENTS

| | | |
|---|---|---|
| 4,785,247 A | 11/1988 | Meador et al. |
| 6,166,540 A | 12/2000 | Wollin |
| 6,993,297 B2 | 1/2006 | Smith |
| 7,212,789 B2 | 5/2007 | Kuffner |
| 7,348,781 B2 | 3/2008 | Tabanou et al. |
| 8,120,369 B2 | 2/2012 | Hernandez |
| 8,190,109 B2 | 5/2012 | Ali et al. |
| 8,233,861 B1 | 7/2012 | Cripe et al. |
| 8,542,078 B2 | 9/2013 | De Jongh |
| 2011/0251794 A1 | 10/2011 | Bittar et al. |
| 2012/0247679 A1 | 10/2012 | Yamazawa |
| 2013/0176030 A1 | 7/2013 | Simon |
| 2013/0187647 A1 | 7/2013 | Walsh et al. |
| 2013/0328734 A1 | 12/2013 | Thind |
| 2016/0142035 A1* | 5/2016 | De Foucauld ........... H01Q 1/50 343/861 |

OTHER PUBLICATIONS

"Wide-Frequency Range, Dynamic Matching Network and Power System for the "Shoelace" RF Antenna on the Alcator C-Mod Tokamak" to Golfinopoulos et al. dated Apr. 2014.
"Designing an Impedance Matched Antenna: FEKO and Optenni Lab" undated.

* cited by examiner

DOWNHOLE LOGGING TOOL USING RESONANT CAVITY ANTENNAS WITH REAL-TIME IMPEDANCE MATCHING

BACKGROUND

Modern oil field operations demand a great quantity of information relating to downhole conditions. Such information typically includes characteristics of the earth formations traversed by the borehole, data relating to the size of the borehole, and data relating to the configuration of the borehole. The collection of information relating to downhole conditions, which is commonly referred to as logging, can be performed using several methods including wireline logging and logging while drilling (LWD). A variety of logging tools are available for use with each of these methods.

One example of a wireline logging and LWD tool is a high-frequency dielectric tool (HFDT). A HFDT determines the dielectric constant and conductivity of downhole formations from the real and complex parts of the propagation constant of electromagnetic waves traveling through the formations. Considering a specific example, a HFDT may use a microwave signal of 1 gigahertz to measure the bulk volume of water (BVW), which helps to evaluate the amount of movable hydrocarbons in a reservoir.

The signals received by a HFDT are subject to attenuation of 50 dB or more. As such, increasing signal strength, while at the same time reducing noise and unintended couplings, is paramount. One way to increase signal strength is through impedance matching.

A HFDT typically includes multiple resonant cavity antennas, each coupled to a coaxial feed cable. As a signal travels through, out of, and back into the HFDT via the transmit and receive antennas it encounters differences in impedance especially at interfaces, e.g. from formation to antenna. At each interface, a portion of the signal's energy reflects back depending on how well the impedances are matched. The less energy that is reflected, the better the impedance is matched and the more power transfers through the interface. In conventional dielectric logging systems, the impedance matching is implemented by connecting the receive cavity antenna directly to the coaxial cable, which may have an impedance of 50Ω or 75Ω. While simple, this method results in a weak average signal because the impedance matching is not robust.

BRIEF DESCRIPTION OF THE DRAWINGS

Accordingly, there are disclosed herein various systems and methods for real-time impedance matching in an impedance-matching circuit or network. In the following detailed description of the various disclosed embodiments, reference will be made to the accompanying drawings in which.

Figure 1:
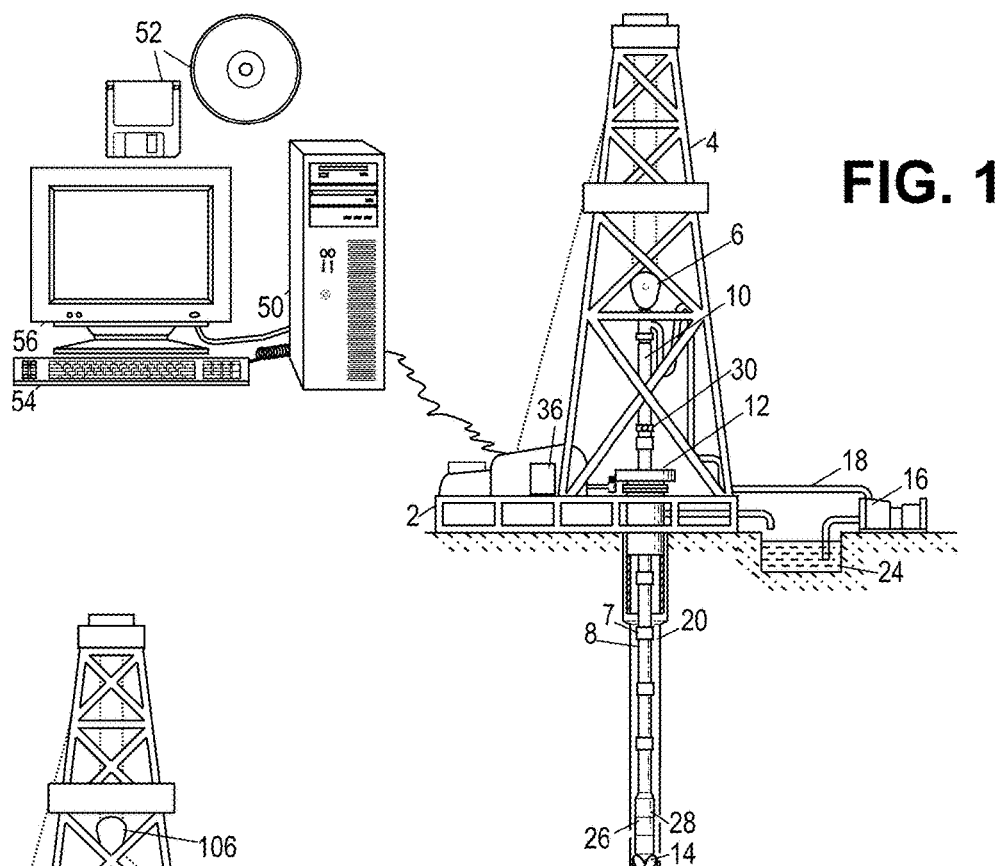
FIG. 1 is a contextual view of an illustrative logging while drilling (LWD) environment.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

NOTATION AND NOMENCLATURE

Certain terms are used throughout the following description and claims to refer to particular system components and configurations. As one of ordinary skill will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or a direct electrical or physical connection. Thus, if a first device couples to a second device, that connection may be through a direct electrical connection, through an indirect electrical connection via other devices and connections, through a direct physical connection, or through an indirect physical connection via other devices and connections in various embodiments.

DETAILED DESCRIPTION

The issues identified in the background are at least partly addressed by systems and methods of real-time impedance matching in an impedance-matching circuit or network. In one specific embodiment, a high-frequency dielectric tool (HFDT) includes one or more impedance-matching circuits including a variable inductor, a variable capacitor, or both to perform impedance matching in real time by adjusting the impedance of the matching circuit as the tool travels along the borehole.

The disclosed systems and methods for using real-time impedance matching are best understood in terms of the context in which they are employed. As such, FIG. 1 shows a well during drilling operations. A drilling platform 2 is equipped with a derrick 4 that supports a hoist 6. Drilling of oil and gas wells is carried out by a string of drill pipes connected together by "tool" joints 7 so as to form a drill string 8. The hoist 6 suspends a kelly 10 that lowers the drill string 8 through rotary table 12. Connected to the lower end of the drill string 8 is a drill bit 14. The bit 14 is rotated and drilling is accomplished by rotating the drill string 8, by use of a downhole motor near the drill bit, or by both methods.

Drilling fluid, termed mud, is pumped by mud recirculation equipment 16 through a supply pipe 18, through the drilling kelly 10, and down through the drill string 8 at high pressures and volumes to emerge through nozzles or jets in the drill bit 14. The mud then travels back up the hole via the annulus formed between the exterior of the drill string 8 and the borehole wall 20, through a blowout preventer, and into a mud pit 24 on the surface. On the surface, the drilling mud is cleaned and then recirculated by recirculation equipment 16.

For a logging while drilling (LWD) environment, downhole sensor instrumentation 26 is located in the drillstring 8 near the drill bit 14. The sensor instrumentation 26 may include directional instrumentation and a HFDT tool. The directional instrumentation measures the inclination angle, the horizontal angle, and the azimuthal angle (also known as the rotational or "tool face" angle) of the LWD tools. Additionally, a three axis magnetometer measures the earth's magnetic field vector. From combined magnetometer and accelerometer data, the horizontal angle of the LWD tool can be determined. In addition, a gyroscope or other form of inertial sensor may be incorporated to perform position measurements and further refine the orientation measurements. The HFDT tool may include a transmit cavity antenna, a cable that routes signals within the tool, and a receive cavity antenna. The transmit cavity antenna may transmit signals through a subsurface formation and an impedance-matching circuit including a variable inductor or a variable capacitor. The cable may be a coaxial feed cable coupled to both the transmit cavity antenna and the receive cavity antenna. The receive cavity antenna may receive a signal from the formation via the adjusted impedance of the matching circuit.

In some embodiments, downhole sensor instrumentation 26 is coupled to a telemetry transmitter 28 that transmits telemetry signals by modulating the mud flow in drill string 8. A telemetry receiver 30 is coupled to the kelly 10 to receive transmitted telemetry signals. Other telemetry transmission techniques may also be used. The receiver 30 communicates the telemetry to an acquisition module 36 coupled to a data processing system 50.

The data processing system 50 includes internal data storage and memory having software (represented by removable information storage media 52), along with one or more processor cores that execute the software. The software configures the system to interact with a user via one or more input/output devices (such as keyboard 54 and display 56). Among other things, system 50 processes data received from acquisition module 36 and generates a representative display for the driller to perceive.

Figure 2:
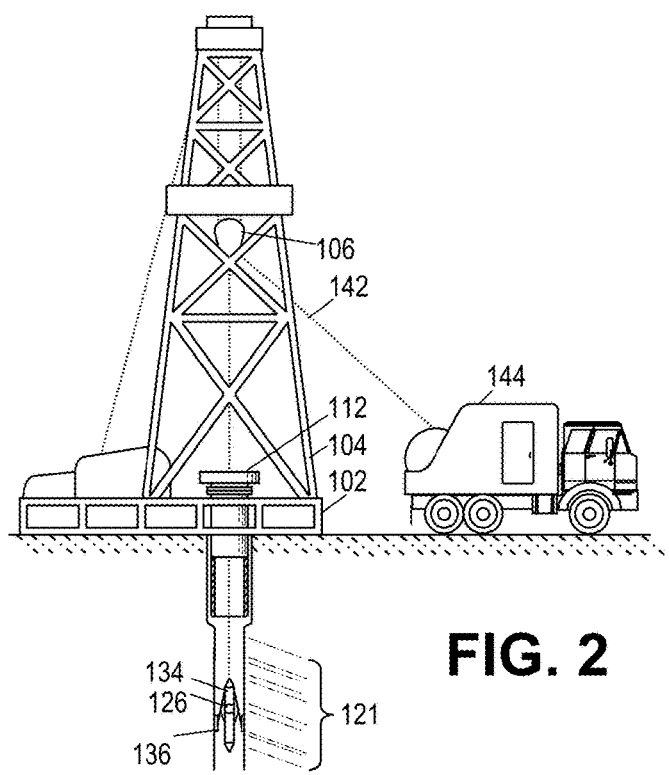
FIG. 2 is a contextual view of an illustrative wireline environment.

In an illustrative wireline environment, shown in FIG. 2, a drilling platform 102 is equipped with a derrick 104 that supports a hoist 106. At various times during the drilling process, the drill string is removed from the borehole. Once the drill string has been removed, logging operations can be conducted using a wireline logging tool 134, i.e. a sensing instrument sonde suspended by a wireline 142, run through the rotary table 112, having conductors for transporting power to the tool and telemetry from the tool to the surface. The wireline logging tool 134 may include sensor instrumentation 126, and the sensor instrumentation 126 may include a HFDT tool. The HFDT tool may include a transmit cavity antenna, a cable that routes signals within the tool, and a receive cavity antenna. The transmit cavity antenna may transmit signals through a subsurface formation and an impedance-matching circuit including a variable inductor or a variable capacitor. The cable, not to be confused with the wireline 142, may be a coaxial feed cable coupled to both the transmit cavity antenna and the receive cavity antenna. The receive cavity antenna may receive a signal from the formation via the adjusted impedance of the matching circuit. A multi-component induction logging portion of the logging tool 134 may have centralizing arms 136 that center the tool within the borehole as the tool is pulled uphole. A logging facility 144 collects measurements from the logging tool 134, and includes a processing system for processing and storing the measurements 121 gathered by the logging tool from the formation.

Figure 3:
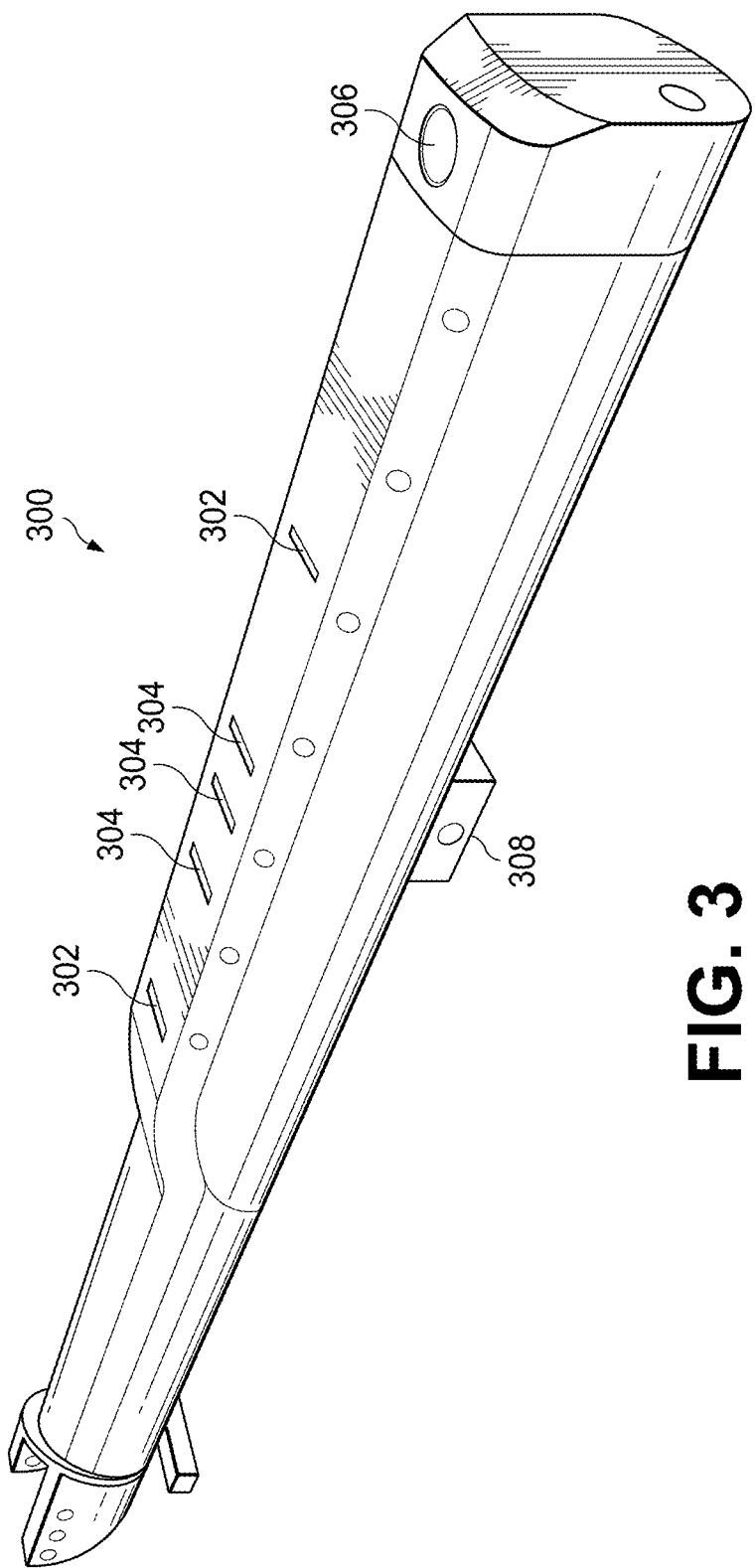
FIG. 3 is an external view of an illustrative high frequency dielectric tool (HFDT)

FIG. 3 is an external view of an illustrative HFDT 300. The HFDT 300 provides logs of formation permittivity, formation conductivity, and the like based on data collected by sensors. Logs of water-saturated porosity and/or oil movability can also be obtained from the collected data. The HFDT 300 includes transmit cavity antennas 302, receive cavity antennas 304, a temperature sensor 306, a cable internal to the HFDT 300, and a pad 308. As shown, three receive cavity antennas 304 are positioned between two transmit cavity antennas 308, which operate in the range between 100 MHz and 10 GHz. The cable may be a coaxial feed cable that route signals within the tool 300 and couples at least one transmit cavity antenna 302 to at least one receive cavity antenna 304. The greater number of receive cavity antennas offers an extended operating range, additional depths of investigation, and increased measurement accuracy. The temperature sensor 306 collects downhole temperature data, and the pad 308 may extend from the tool body to contact the borehole wall. As such, the receive cavity antennas 304 are in close proximity to the borehole wall during operation in order to minimize the thickness of the fluid layer between the receive cavity antennas 304 and the borehole wall. Other mechanisms including extendable arms or biasing springs may be used for similar purposes.

As the HFDT 300 rotates and moves downhole, the transmit cavity antennas 302 transmit signals into the formation and the receive cavity antennas 304 receive the formation responses. The frequency content of the transmitted signals may be concentrated at a small number of selected frequencies, e.g., in the range from 1 to 6 selected frequencies. The windowed signal pulses may be between 10 microseconds to 10 milliseconds long. At each signal frequency, the HFDT 300 measures received signal attenuation and phase shift relative to the transmitted signal (i.e., "absolute attenuation and phase measurements"). These measurements are made at each receive cavity antenna 304 in response to each transmit cavity antenna 302, with the transmit cavity antennas 302 firing in turn. From the absolute phase and attenuation measurements, the differential phase and attenuation measurements may be calculated, i.e., the phase and attenuation of the signal frequency measured at one receive cavity antenna 304 relative to the phase and attenuation of that signal frequency at another receive cavity antenna 304. Orientation sensors within the HFDT 300 may be used to associate the responses with position information. Electronics within the HFDT 300 may aggregate measurements versus position to form a detailed map of the formation, which can be stored for later retrieval or compressed and transmitted to the surface for timely use by the drilling team. However, the detailed map or model of the formation may be limited by data with a high uncertainty due to impedance mismatch as described above.

Figure 4:
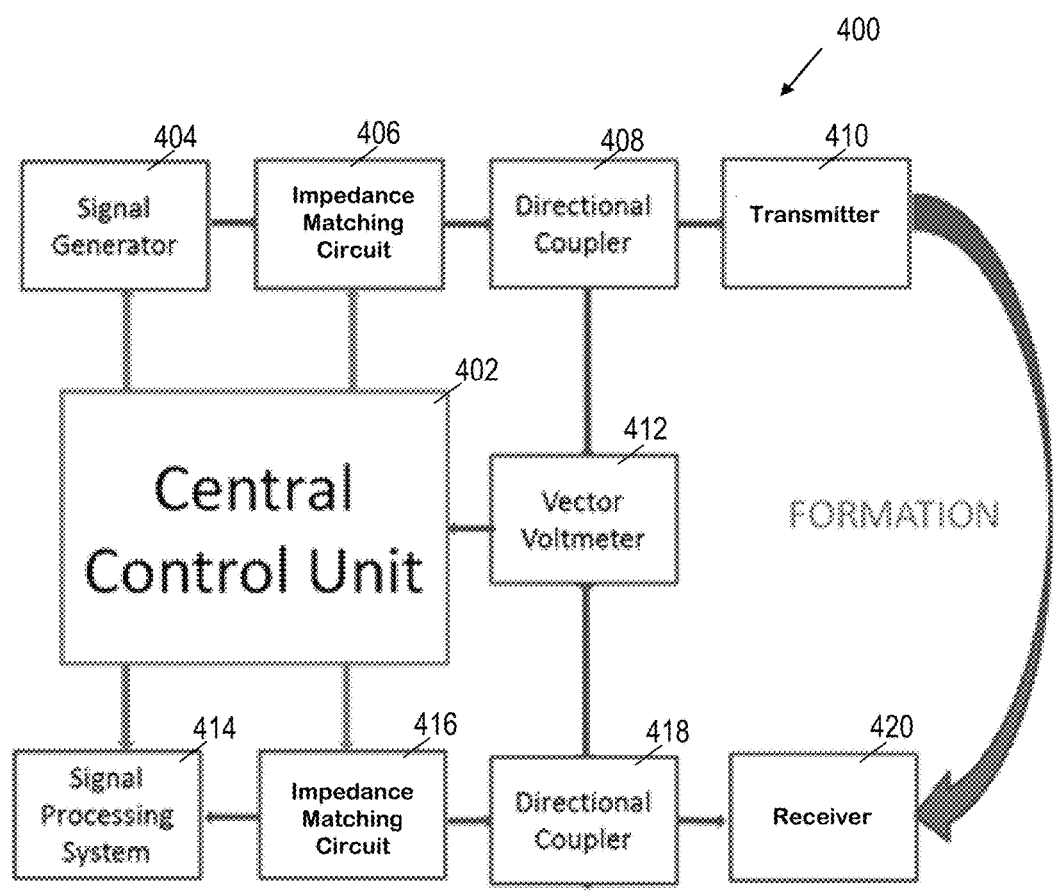
FIG. 4 is a function block diagram of an illustrative HFDT.
Figure 5:
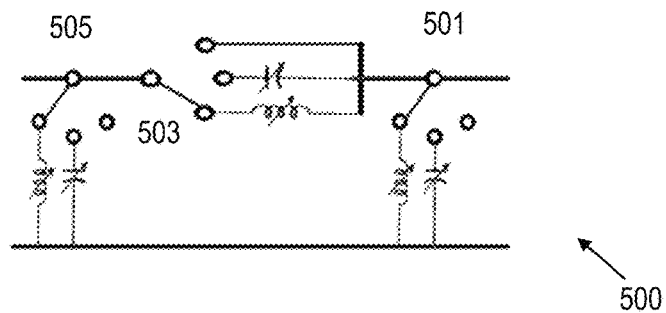
FIG. 5 is a general circuit diagram of an impedance-matching circuit.
Figure 6:
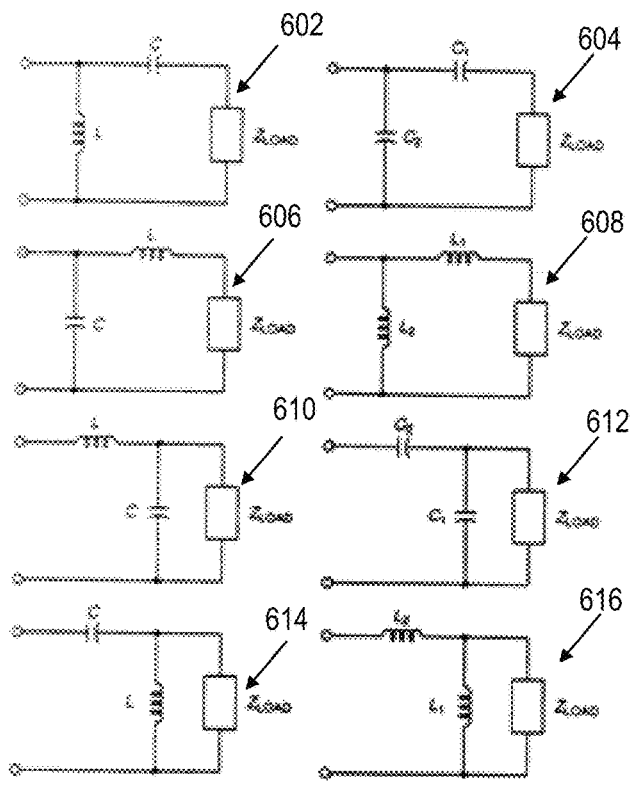
FIG. 6 is multiple circuit diagrams of specific impedance-matching circuits.

Turning to FIG. 5, a general circuit diagram of an impedance-matching circuit 500, which may be placed in a HFDT to relieve the impedance mismatch between each cavity antenna and the formation, is shown. The circuit 500 may be used to perform real-time impedance matching for a transmit cavity antenna or receive cavity antenna of the HFDT. The circuit 500 includes three single-pole-triple-throw switches 501, 503, 505. Two of the switches 501, 505 may be positioned to include a variable inductor or variable capacitor in the electrical path; otherwise they may be positioned in an open state. One switch 503 may be positioned to include a variable inductor or variable capacitor in the electrical path; otherwise it may be positioned in a short state. With two switches 501, 505 open and one switch 503 short, the circuit 500 acts as a transmission line. The inductance and capacitance of the variable inductors and capacitors are controlled by electrical signal (voltage or current). For example, an analog device may implement an artificial voltage-controlled capacitance or inductance by injecting the current of a voltage-controlled current source onto a fixed capacitor or inductor. Then, by controlling the transconductance of the current source using an external bias voltage, a voltage-controlled capacitive or inductive reactance is obtained. By adjusting the switches 501, 503, 505, the general circuit 500 may become any specific circuit 602, 604, 606, 608, 610, 612, 614, 616 illustrated in FIG. 6. The circuits of FIG. 6 are L-shaped circuits that use two reactive elements to match a load impedance to a transmission line. Selection of a particular circuit 602, 604, 606, 608, 610, 612, 614, 616, and adjustment of the parameters of the variable inductors and capacitors (C, L, $C_1$, $C_2$, $L_1$, $L_2$) may be performed by a central control unit as discussed with respect to FIG. 4.

FIG. 4 is a function block diagram of a HFDT 400. A central control unit 402 is coupled to a signal generator 404, a signal processing system 414, impedance-matching circuits 406, 416, and a vector voltmeter 412. Directional couplers 408, 418 are also coupled to the vector voltmeter 412. One directional coupler 408 is coupled to a transmit cavity antenna 410, and another directional coupler 418 is coupled to a receive cavity antenna 420. One impedance-matching circuit 406 couples the signal generator 404 to one directional coupler 408, and the other impedance-matching circuit 416 couples the signal processing system 414 to the other directional coupler 418.

The central control unit 402 may be a processor and may be coupled to memory for data storage and software execution purposes. The signal generator 404 may be a radio frequency (RF) signal generator used to generate a signal for output to the impedance-matching circuit 406. The transmit-side impedance-matching circuit 406 may receive the generated signal as input and operate as a transmission line if the formation impedance is not known or real-time impedance matching is not enabled in the HFDT 400. In this mode of operation, the impedance-matching circuit 406 may output an unadjusted signal to the directional coupler 408. If the formation impedance is known (or the reflection is measured as discussed below), the central control unit 402 may position the switches and adjust the variable capacitors and/or the variable inductors of the impedance-matching circuit 408 based on the formation impedance to perform real-time impedance matching between the transmitting network and the formation. As such, the impedance-matching circuit 406 may output an adjusted signal to the directional coupler 408.

The directional coupler 408 receives either an adjusted or unadjusted signal from the impedance-matching circuit 406 as input. The directional coupler outputs such input to the transmit cavity antenna 410. The transmit cavity antenna 410 receives the adjusted or unadjusted signal from the directional coupler 408 as input, and outputs the adjusted or unadjusted signal to the formation by antenna in at least one embodiment. An unadjusted signal will likely cause a reflection signal, and the reflection signal is routed by the directional coupler 408 from the transmit cavity antenna to the vector voltmeter 412 for measurement.

The formation response is received by the receive cavity antenna 420, including an antenna in at least one embodiment, and routed by the directional coupler 418 to the receive-side impedance-matching circuit 416. If operating as a transmission line, a reflection will likely occur, and the reflection is routed by the directional coupler 418 to the vector voltmeter 412. If operating in impedance matching-mode, the central control unit 402 may position the switches and adjust the variable capacitors and/or the variable inductors of the impedance-matching circuit 416 to perform real-time impedance matching between the formation and the receiving network. The signal processing system 414 may include external or embedded digital signal processing (DSP) elements used to process the signal for logging purposes.

The vector voltmeter 412 includes a device that measures the magnitude and phase of a voltage signal, and is used to monitor the reflection for the transmit cavity antenna ($S_{11}$) and the reflection for the receive cavity antenna ($S_{22}$). Collectively, these two measurements are known as the S-parameters. The measured S-parameters are passed to the central control unit 402, which calculates the desirable topology and parameters of the circuits 406, 416. Specifically, the central control unit 402 configures the states of the three switches in the circuits 406, 416, and sets the parameters of the variable conductors and/or variable inductors based on a target impedance. The target impedance, $Z_s$, may be calculated using the equation $$Z_S = \frac{Z_0(-\Gamma_S - 1)}{\Gamma_S - 1},$$

where $Z_0$ is the impedance of a coaxial cable routing signals through the HFDT 400 and $\Gamma_S$ is the complex conjugate of the reflection coefficient, i.e. $\Gamma_S = S_{11}^*$ (for the transmit side) or $\Gamma_S = S_{22}^*$ (for the receive side). The calculation will inform the circuit selection as discussed below with respect to FIG. 6.

Returning to FIG. 6, the impedance-matching circuit coupled to the transmit cavity antenna is selected based on the reflection $S_{11}$ at the transmit cavity antenna, and the impedance-matching circuit coupled to the receive cavity antenna is selected based on the reflection $S_{22}$ at the receive cavity antenna. Specifically, $Z_s$ includes a real component and complex component, and will be of the form $Z_s = R_s + jX_s$.

If $R_s < Z_0$, then $$\frac{1}{Z_S} = jB + \frac{1}{Z_0 + jX},$$

where $(jB)^{-1}$ is the impedance of one inductor/capacitor in the L-shaped impedance-matching circuit and $jX$ is the impedance of the other inductor/capacitor in the L-shaped impedance-matching circuit. A positive complex component indicates an inductor should be selected while a negative complex component indicates a capacitor should be selected.

If $R_s > Z_0$, then $$\frac{1}{\frac{1}{Z_0} + jB} + jX = Z_S,$$

where $(jB)^{-1}$ is the impedance of one inductor/capacitor in the L-shaped impedance-matching circuit and $jX$ is the impedance of the other inductor/capacitor in the L-shaped impedance-matching circuit. A positive complex component indicates an inductor should be selected while a negative complex component indicates a capacitor should be selected.

Figure 7:
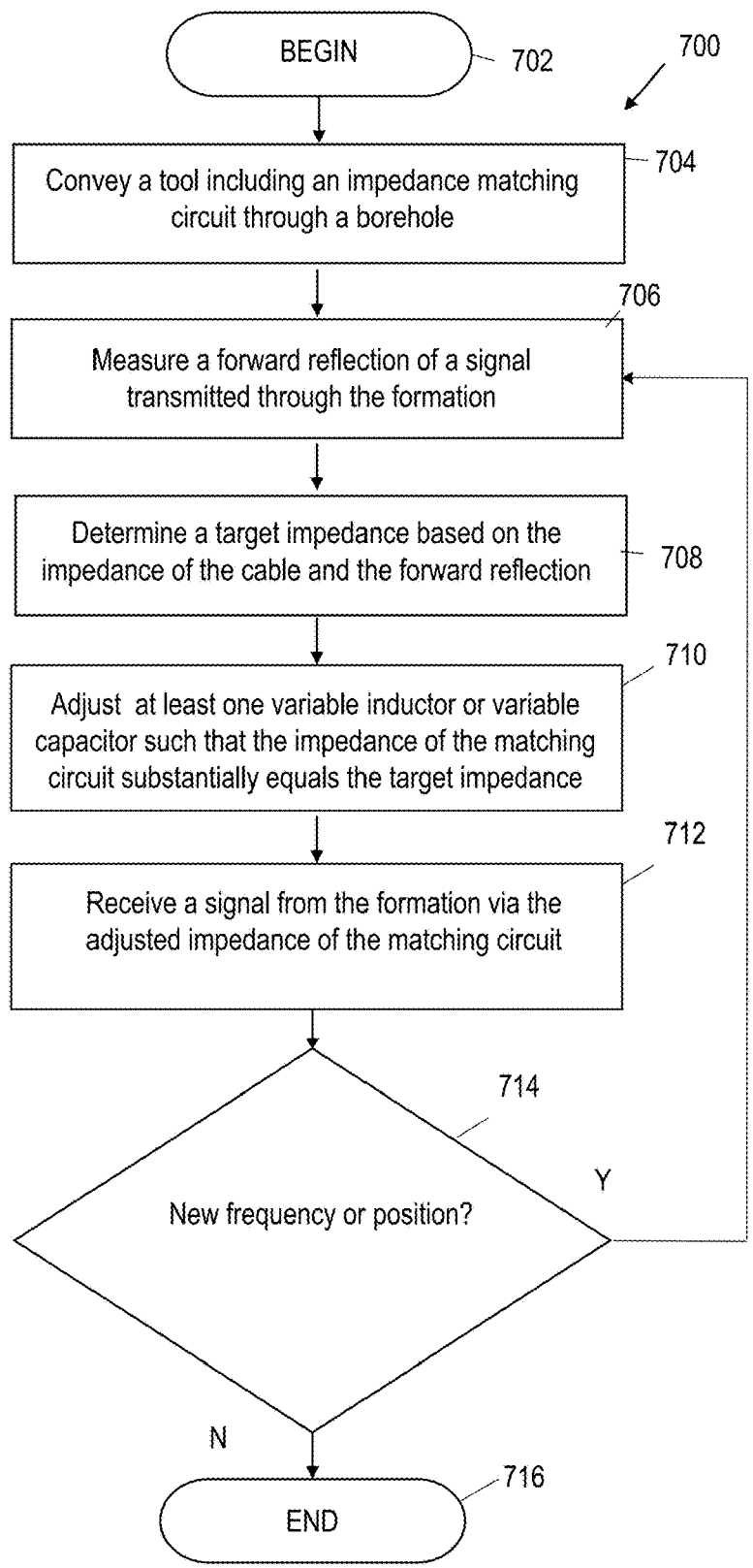
FIG. 7 is a flow diagram of an illustrative method of real-time impedance matching.

FIG. 7 is a flow diagram of an illustrative method 700 of real-time impedance matching beginning at 702 and ending at 716. At 704, a tool is conveyed through a borehole; the tool includes a transmit cavity antenna and receive cavity antenna for transmitting and receiving signals through a subsurface formation. The tool also includes a cable for routing signals within the tool and at least one variable inductor or variable capacitor in an impedance-matching circuit. The cable may be a coaxial cable, and the tool may be a HFDT.

At 706, a forward reflection of a signal transmitted from the transmit cavity antenna to the formation is measured. The forward reflection, $S_{11}$, is caused by impedance mismatch at the interface between the transmit cavity antenna and the formation. Similarly, the backward reflection, $S_{22}$, caused by impedance mismatch at the interface between the formation and the receive cavity antenna may be measured.

At 708, a target impedance is determined based on the impedance of the cable and the forward reflection. Determining the target impedance, $Z_s$, may include calculating $$\frac{Z_0(-\Gamma_S - 1)}{\Gamma_S - 1},$$

where $Z_0$ is the impedance of the cable and $\Gamma_S$ is the complex conjugate of the forward reflection. Similarly, determining the target impedance, $Z_s$, may include calculating $$Z_S = \frac{Z_0(-\Gamma_S - 1)}{\Gamma_S - 1},$$

where $Z_0$ is the impedance of the cable and $\Gamma_S$ is the complex conjugate of the backward reflection.

At 710, at least one variable inductor or variable capacitor in the transmit or receive impedance-matching circuit is adjusted such that the impedance of the matching circuit substantially matches the target impedance. Adjusting the at least one variable inductor or variable capacitor may include selecting a circuit configuration to match the target impedance and adjusting switches in the matching circuit such that the matching circuit mimics the selected circuit configuration. Selecting the circuit configuration may include selecting the circuit configuration out of 8 potential circuit configurations, each including a variable inductor or variable capacitor.

At 712, with the one or more impedance matching circuits tuned, a subsequent signal is transmitted to and received from the formation via the adjusted impedance of the one or more impedance-matching circuits. Data about the borehole may be logged based on the received signal, and a formation property may be derived based at least in part on the received signal. The data and subsequent log are highly accurate, e.g. the signal-to-noise ratio of the received signals is optimized, due to the impedance matching.

At 714, the HFDT may be repositioned or the frequency may be adjusted. If either occurs, the measuring, determining, adjusting, and receiving may be repeated at a different signal frequency or at a different position along the borehole.

A method of real-time impedance matching includes conveying a tool through a borehole where the tool includes a transmit cavity antenna and receive cavity antenna for transmitting and receiving signals through a subsurface formation. The tool also includes a cable for routing signals within the tool and at least one variable inductor or variable capacitor in an impedance-matching circuit. The method further includes measuring a reflection of a signal transmitted through the formation and determining a target impedance based on the impedance of the cable and the reflection. The method further includes adjusting the at least one variable inductor or variable capacitor such that the impedance of the matching circuit substantially equals the target impedance and receiving a signal from the formation via the adjusted impedance of the matching circuit.

The measuring, determining, adjusting, and receiving may be repeated at a different signal frequency or at a different position along the borehole. Adjusting the at least one variable inductor or variable capacitor may include selecting a circuit configuration to match the target impedance and adjusting switches in the matching circuit such that the matching circuit mimics the selected circuit configuration. Selecting the circuit configuration may include selecting the circuit configuration out of 8 potential circuit configurations, each including a variable inductor or variable capacitor. Determining the target impedance, $Z_s$, may include calculating $$Z_S = \frac{Z_0(-\Gamma_S - 1)}{\Gamma_S - 1},$$

where $Z_0$ is the impedance of the cable and $\Gamma_S$ is the conjugate of the reflection. Data about the borehole may be logged based on the received signal. The cable may be a coaxial cable. The tool may be a high-frequency dielectric tool. A formation property may be derived based at least in part on the received signal.

A system for real-time impedance matching includes a transmit cavity antenna that transmits signals through a subsurface formation and an impedance-matching circuit including a variable inductor or a variable capacitor. The system further includes a cable that routes signals within the system. The system further includes a processor that measures a reflection of a signal transmitted through the formation, determines a target impedance based on the impedance of the cable and the reflection, and adjusts the at least one variable inductor or capacitor such that the impedance of the matching circuit substantially equals the target impedance. The system further includes a receive cavity antenna that receives a signal from the formation via the adjusted impedance of the matching circuit.

The matching circuit may include three single pole triple throw switches, one throw on each switch coupled to a variable inductor, and another throw on each switch coupled to a variable capacitor. The switches may be positioned such that every variable inductor and variable capacitor may be bypassed. The processor may repeat said measuring, determining, and adjusting for different signal frequencies or for different positions along a borehole. Adjusting the at least one variable inductor or variable capacitor may cause the processor to select a circuit configuration to match the target impedance and adjust switches in the matching circuit such that the matching circuit mimics the selected circuit configuration. Selecting the circuit configuration may cause the processor to select the circuit configuration out of 8 potential circuit configurations, each including a variable inductor or variable capacitor. Determining the target impedance, $Z_S$, may cause the processor to calculate $$Z_S = \frac{Z_0(-\Gamma_S - 1)}{\Gamma_S - 1},$$

What is claimed is:

1. A system for real-time impedance matching comprising:
a transmit cavity antenna that transmits signals through a subsurface formation;
an impedance-matching circuit comprising a variable inductor or a variable capacitor, wherein the impedance-matching circuit comprises three single pole triple throw switches, one throw on each switch coupled to a variable inductor, and another throw on each switch coupled to a variable capacitor;
a cable that routes signals within the system; and
a processor that:
measures a reflection of a signal transmitted through the formation;
determines a target impedance based on the impedance of the cable and the reflection; and
adjusts the at least one variable inductor or capacitor such that the impedance of the matching circuit substantially equals the target impedance.

2. The system of claim 1, wherein adjusting the at least one variable inductor or variable capacitor causes the processor to select a circuit configuration to match the target impedance and adjust switches in the impedance-matching circuit such that the impedance-matching circuit mimics the selected circuit configuration.

3. The system of claim 2, wherein selecting the circuit configuration causes the processor to select the circuit configuration out of 8 potential circuit configurations, each comprising a variable inductor or variable capacitor.

4. The system of claim 1, wherein the switches are positioned such that every variable inductor and variable capacitor may be bypassed.

5. The system of claim 1, wherein the processor repeats said measuring, determining, and adjusting for different signal frequencies.

6. The system of claim 1, wherein the processor repeats said measuring, determining, and adjusting for different positions along a borehole.

7. The system of claim 1, wherein determining the target impedance, $Z_S$, causes the processor to calculate $$Z_S = \frac{Z_0(-\Gamma_S - 1)}{\Gamma_S - 1},$$

where $Z_0$ is the impedance of the cable and $\Gamma_S$ is the conjugate of the reflection.

8. The system of claim 1, wherein the cable is a coaxial cable.

9. The system of claim 1, wherein the tool is a high-frequency dielectric tool.

10. A method of real-time impedance matching comprising:
conveying a tool through a borehole, the tool comprising a transmit cavity antenna and receive cavity antenna for transmitting and receiving signals through a subsurface formation respectively, a cable for routing signals within the tool, and at least one variable inductor or variable capacitor in an impedance-matching circuit, wherein the impedance-matching circuit comprises three single pole triple throw switches, one throw on each switch coupled to a variable inductor, and another throw on each switch coupled to a variable capacitor;
measuring a reflection of a signal transmitted through the formation;
determining a target impedance based on the impedance of the cable and the reflection; and
adjusting the at least one variable inductor or variable capacitor in such that the impedance of the impedance-matching circuit substantially equals the target impedance.

11. The method of claim 10, wherein adjusting the at least one variable inductor or variable capacitor further comprises selecting a circuit configuration to match the target impedance and adjusting switches in the impedance-matching circuit such that the impedance-matching circuit mimics the selected circuit configuration.

12. The method of claim 11, wherein selecting the circuit configuration comprises selecting the circuit configuration out of 8 potential circuit configurations, each comprising a variable inductor or variable capacitor.

13. The method of claim 10, further comprising repeating said measuring, determining, adjusting, and receiving at a different signal frequency.

14. The method of claim 10, further comprising repeating said measuring, determining, adjusting, and receiving at a different position along the borehole.

15. The method of claim 10, wherein determining the target impedance, $Z_S$, comprises calculating $$Z_S = \frac{Z_0(-\Gamma_S - 1)}{\Gamma_S - 1},$$

where $Z_0$ is the impedance of the cable and $\Gamma_S$ is the conjugate of the reflection.

16. The method of claim 10, further comprising logging data about the borehole based on the received signal.

17. The method of claim 10, wherein the reflection is a forward reflection and wherein the impedance-matching circuit is coupled to the transmit cavity antenna.

18. The method of claim 10, wherein the reflection is a backward reflection and wherein the impedance-matching circuit is coupled to the receive cavity antenna.

19. The method of claim 10, further comprising deriving a formation property based at least in part on received signals.

* * * * *